United States Patent
Xiao et al.

(10) Patent No.: US 12,495,518 B2
(45) Date of Patent: Dec. 9, 2025

(54) LIQUID-COOLING HEAT DISSIPATION DEVICE

(71) Applicant: APALTEK CO., LTD., Shenzhen (CN)

(72) Inventors: Qineng Xiao, Guangdong (CN); Dagao Zheng, Shenzhen (CN); Minrui Chen, Shenzhen (CN)

(73) Assignee: APALTEK CO., LTD., Shenzhen (CN)

( * ) Notice: Subject to any disclaimer, the term of this patent is extended or adjusted under 35 U.S.C. 154(b) by 109 days.

(21) Appl. No.: 18/661,590

(22) Filed: May 11, 2024

(65) Prior Publication Data

US 2025/0287530 A1    Sep. 11, 2025

(30) Foreign Application Priority Data

Mar. 11, 2024   (CN) .......................... 202410279437.7

(51) Int. Cl.
*H05K 7/20* (2006.01)

(52) U.S. Cl.
CPC .................. *H05K 7/20272* (2013.01)

(58) Field of Classification Search
CPC ........... H05K 7/20272; H05K 7/20281; H05K 7/20254; H05K 7/20218; F28D 1/05375; H01L 23/467; H01L 21/4882; G06F 1/20
See application file for complete search history.

(56) References Cited

U.S. PATENT DOCUMENTS

| | | | |
|---|---|---|---|
| 10,609,841 B2* | 3/2020 | Xiao | H01L 23/473 |
| 10,750,638 B2* | 8/2020 | Xiao | F28F 1/126 |
| 11,248,848 B1* | 2/2022 | Huang | F28D 1/0341 |
| 11,379,019 B2* | 7/2022 | Li | G06F 1/185 |
| 11,910,563 B2* | 2/2024 | Chen | H05K 7/20263 |

(Continued)

FOREIGN PATENT DOCUMENTS

| | | |
|---|---|---|
| CN | 102483307 A | 5/2012 |
| CN | 211656711 U | 10/2020 |

(Continued)

OTHER PUBLICATIONS

Office Action dated Feb. 5, 2025 of the corresponding Taiwan patent application No. 113109774.

*Primary Examiner* — Jon T. Schermerhorn, Jr.
(74) *Attorney, Agent, or Firm* — HDLS IPR SERVICES; Chun-Ming Shih

(57) ABSTRACT

A liquid-cooling heat dissipation device includes a liquid-cooling head, a liquid-cooling radiator, a first tank, a second tank, and a flow-guiding structure. The liquid-cooling radiator includes a window and first and second fluid tubes. The flow-guiding structure is embedded in the window and connected between the first and second fluid tubes. The first and second fluid tubes are connected to the first and second tanks respectively. The flow-guiding structure includes first and second chambers and first and second interfaces connected to the first and second chambers respectively. The first and second fluid tubes are respectively connected to the first and second chambers. The liquid-cooling head includes first and second infusion ports connected to the first and second interfaces respectively. Accordingly, the first and second interfaces are designed on the front, back or lateral side of the liquid-cooling radiator to provide greater choices of pipe configuration.

15 Claims, 9 Drawing Sheets

(56) References Cited

U.S. PATENT DOCUMENTS

| | | | | |
|---|---|---|---|---|
| 12,158,307 B2* | 12/2024 | Xiao | .................. | F28D 1/05375 |
| 2018/0340744 A1* | 11/2018 | Tsai | ........................ | F28D 15/00 |
| 2019/0104641 A1* | 4/2019 | Fan | .......................... | G06F 1/20 |
| 2021/0381421 A1* | 12/2021 | Huang | ................ | F16L 27/1017 |
| 2023/0258285 A1* | 8/2023 | Villafuerte | ......... | H05K 7/20272 |
| | | | | 165/80.4 |
| 2025/0287530 A1* | 9/2025 | Xiao | ................. | H05K 7/20272 |

FOREIGN PATENT DOCUMENTS

| | | | | |
|---|---|---|---|---|
| TW | M647556 U | | 10/2023 | |
| TW | 202443061 A | * | 11/2024 | ............ F16L 27/023 |
| TW | M671237 U | * | 6/2025 | |

* cited by examiner

LIQUID-COOLING HEAT DISSIPATION DEVICE

BACKGROUND

Technical Field

The present disclosure relates to a heat dissipation device, and in particular, to a liquid-cooling heat dissipation device.

Description of Related Art

A known liquid-cooling heat dissipation device mainly includes a liquid-cooling radiator, a liquid-cooling head, a pump and two tanks. The liquid-cooling radiator includes a fluid tube assembly, and the two tanks are connected to two ends of the fluid tube assembly. The liquid-cooling head is connected to any one of the tanks with two pipes, and the pump is connected to any one of the pipes.

The known liquid-cooling heat dissipation device is able to achieve desired cooling function; however, the laying method of the two pipes requires the two pipes to be arranged on any one of the tanks at two ends of the liquid-cooling radiator, such that the laying method of the pipes is restricted without flexibility. Due to the lack of choice of pipe laying method, users' willingness to purchase such type of device is reduced.

Accordingly, the inventor seeks to overcome the aforementioned drawbacks of the known art with an innovative solution.

SUMMARY

An objective of the present disclosure is to provide a liquid-cooling heat dissipation device, allowing the first interface and second interface for connecting the liquid-cooling head to have greater flexibility in the installation and position arrangement.

To achieve the aforementioned objective, the present disclosure provides a liquid-cooling heat dissipation device, having: a liquid-cooling radiator having a window and a fluid tube assembly, the fluid tube assembly having a plurality of first fluid tubes and a plurality of second fluid tubes; a tank structure having a first tank and a second tank; a flow-guiding structure embedded in the window and fluidly connected between one end of each of the first fluid tubes and one end of each of the second fluid tubes, another end of each of the first fluid tubes and another end of each of the second fluid tubes fluidly connected to the first tank and the second tank respectively, the flow-guiding structure having a first chamber and a second chamber separated from each other and having a first interface and a second interface connected to the first chamber and the second chamber respectively, the one end of each of the first fluid tubes and the one end of each of the second fluid tubes fluidly connected to the first chamber and the second chamber respectively; and a liquid-cooling head having a first infusion port and a second infusion port, the first infusion port and the second infusion port fluidly connected to the first interface and the second interface respectively.

In comparison to the related art, the present disclosure may achieve the following technical effects. Since the flow-guiding structure is embedded in the window and connected between each of the first fluid tubes and each of the second fluid tubes, the first interface and the second interface of the liquid-cooling head may be arranged and positioned at the front side, back side or lateral side of the liquid-cooling radiator. Accordingly, pipe arrangement may have greater flexibility rather than the arrangement on the first tank or second tank only. As a result, the technical effect of diverse arrangement may be achieved.

DETAILED DESCRIPTION

The technical contents of the present disclosure will become apparent with the detailed description of embodiments accompanied with the illustration of related drawings as follows. It is intended that the embodiments and drawings disclosed herein are to be considered illustrative rather than restrictive.

Figure 5:
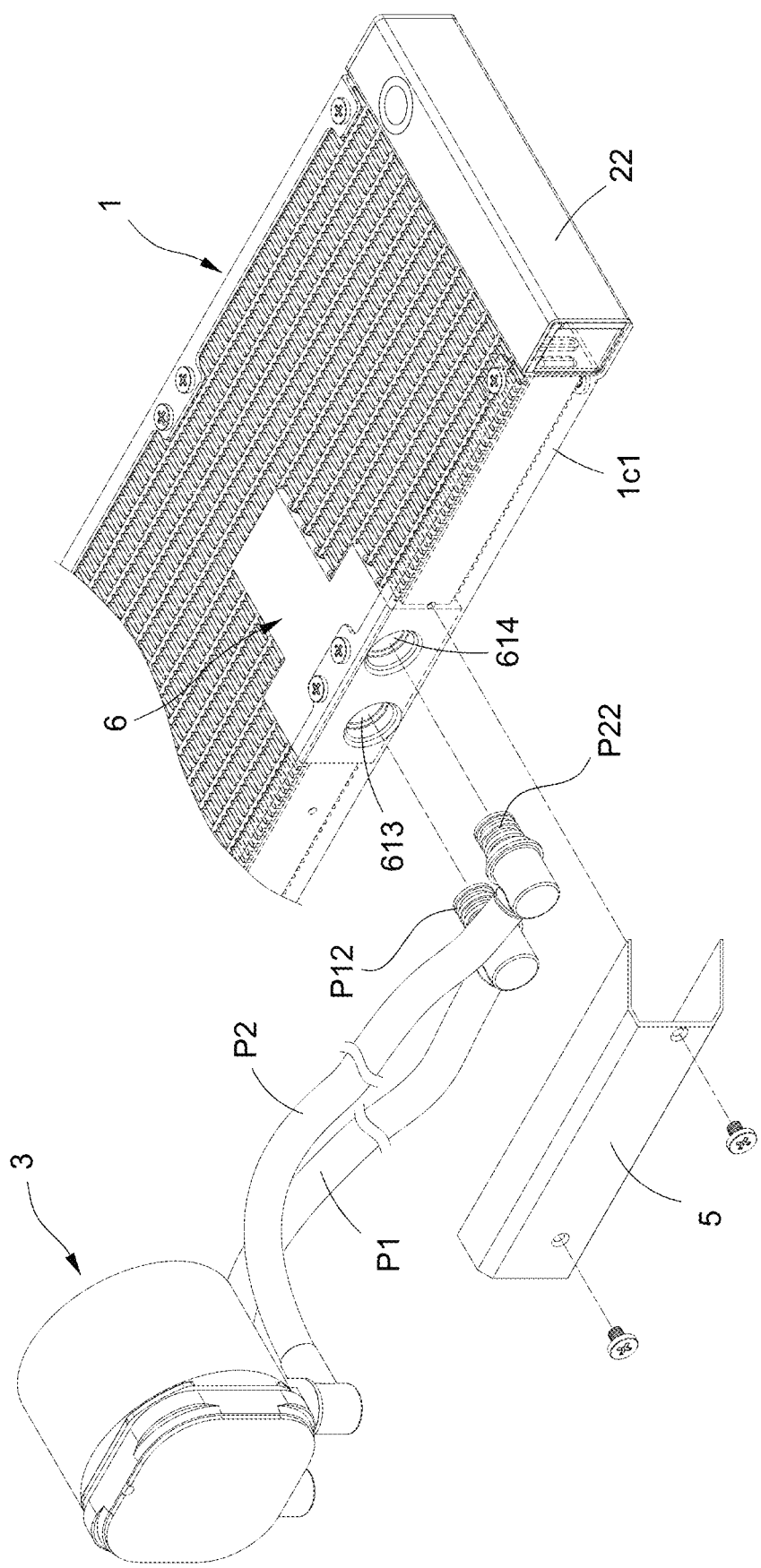
FIG. 5 is a perspective exploded view of the second exemplary embodiment of the present disclosure (fan assembly omitted)
Figure 6:
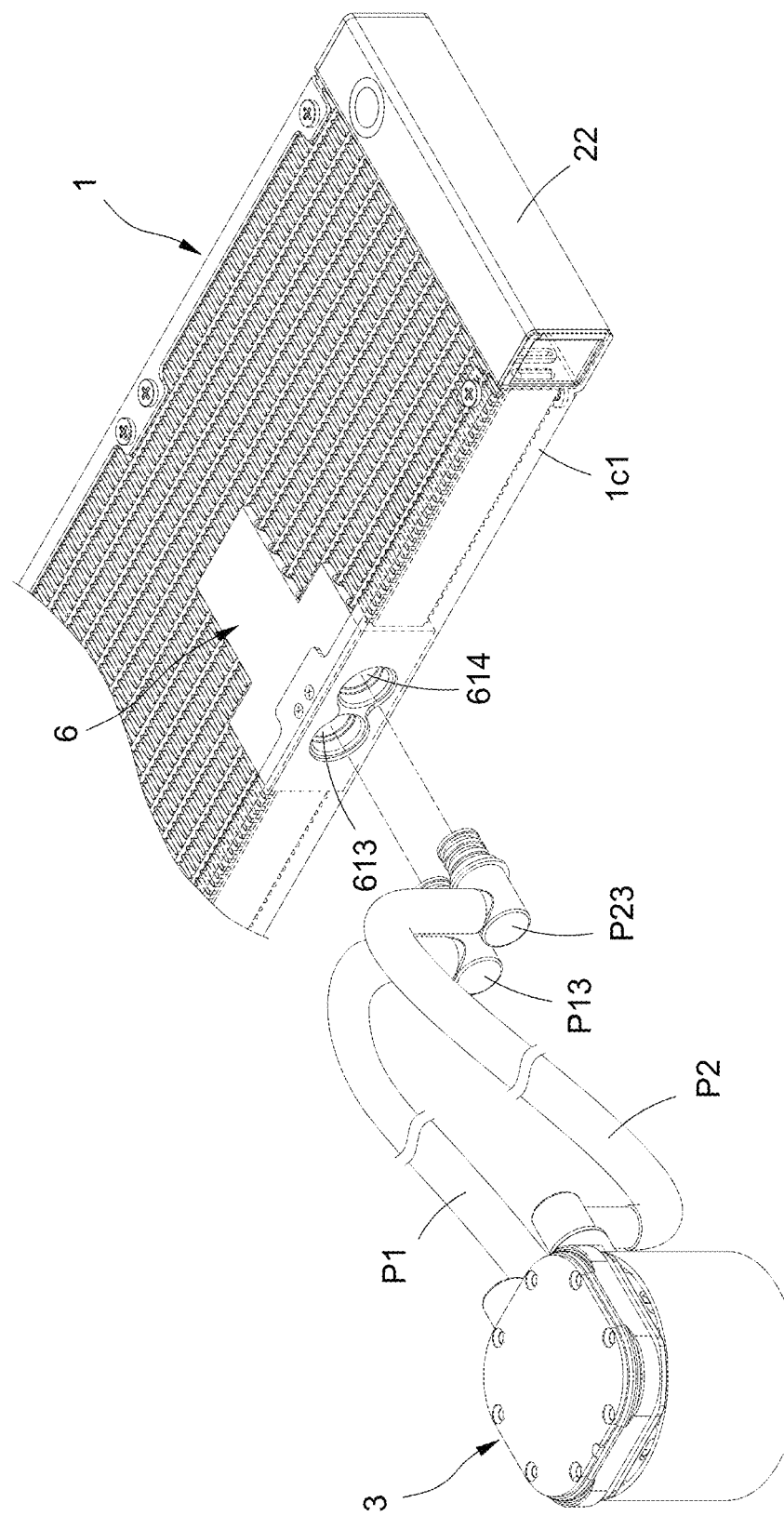
FIG. 6 is a perspective exploded view of the third exemplary embodiment of the present disclosure (fan assembly omitted)
Figure 7:
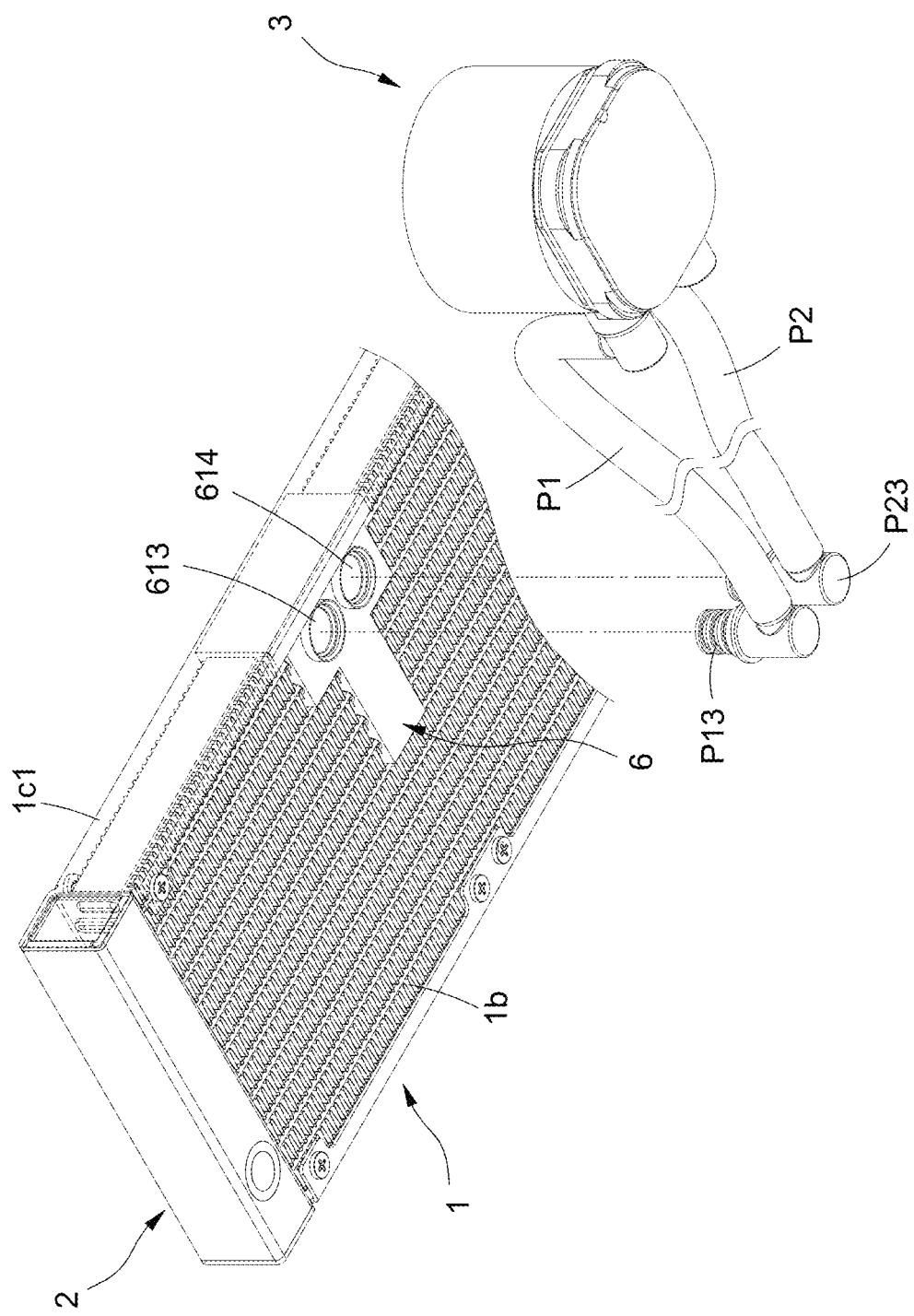
FIG. 7 is a perspective exploded view of the fourth exemplary embodiment of the present disclosure (fan assembly omitted)

The present disclosure provides a liquid-cooling heat dissipation device. FIG. 1 to FIG. 4 show a first exemplary embodiment of the present disclosure, and FIG. 5, FIG. 6 and FIG. 7 show the second, third and fourth exemplary embodiments of the present disclosure respectively.

As shown in FIG. 1 to FIG. 4, according to the first exemplary embodiment of the present disclosure, a liquid-cooling heat dissipation device having: a liquid-cooling radiator 1, a tank structure 2, a liquid-cooling head 3 and a flow-guiding structure 6. In another exemplary embodiment, it may further include a fan assembly 4.

The liquid-cooling radiator 1 is provided to perform heat exchange with the use of a liquid. The liquid-cooling radiator 1 mainly includes a window W, and the flow-guiding structure 6 is embedded in the window W.

To be more specific, the liquid-cooling radiator 1 includes a front side 1a and a back side 1b separated and opposite from each other, and a plurality of side surfaces 1c surrounding the front side 1a and the back side 1b jointly. The present disclosure is not limited to any shape of the liquid-cooling radiator 1. In this exemplary embodiment, a rectangular body is used as an example for illustration. The plurality of side surfaces 1c include two long lateral sides 1c1 separated and opposite from each other and two short lateral sides (not labeled with a component sign). The window W is located between the two short lateral sides and penetrates through the front side 1a and the back side 1b of the liquid-cooling radiator 1. In addition, the window W may not be a through-type window but may be a recess recessed inward at the front side 1a or the back side 1b.

Figure 3:
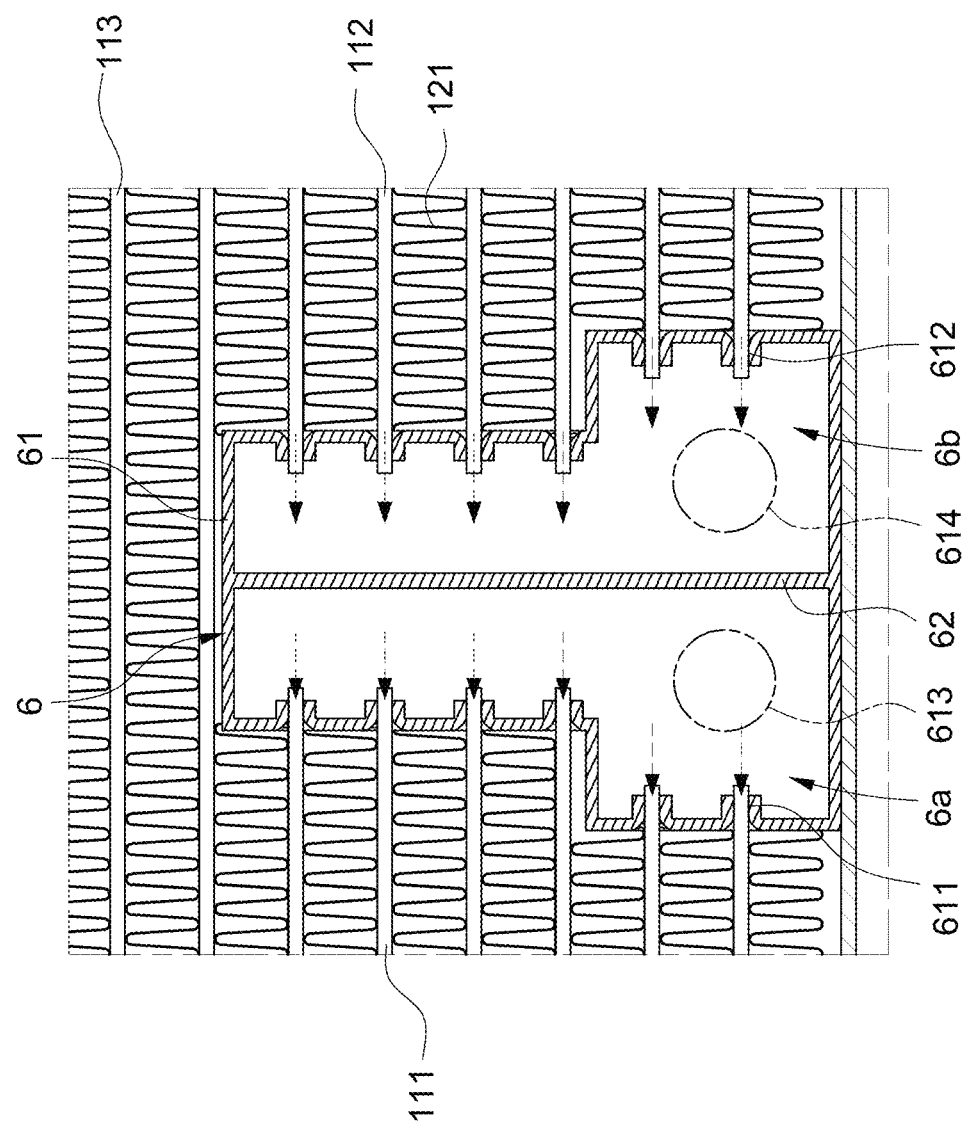
FIG. 3 is a partially cross-sectional view of the present disclosure according to FIG. 1.

The liquid-cooling radiator 1 includes a fluid tube assembly 11 and a heat sink assembly 12. The fluid tube assembly 11 includes a plurality of fluid tubes separated from and parallel to each other. The plurality of fluid tubes includes a plurality of first fluid tubes 111 and a plurality of second fluid tubes 112. In another embodiment, it may further include a plurality of third fluid tubes 113. The heat sink assembly 12 includes a plurality of heat dissipation fins 121 (as shown in FIG. 3), each one of the heat dissipation fins 121 arranged between any two fluid tubes adjacent thereto.

The tank structure 2 is used to receive the fluid for heat exchange. The tank structure 2 includes a first tank 21 and a second tank 22. Each of the third fluid tubes 113 is fluidly connected between the first tank 21 and the second tank 22. Accordingly, the first tank 21 and the second tank 22 are located at the two short lateral sides of the liquid-cooling radiator 1 respectively.

The flow-guiding structure 6 is used to provide two channels including one inlet channel and one outlet channel (not labeled with component signs) for guiding the fluid in the window W of the liquid-cooling radiator 1. The flow-guiding structure 6 is embedded in the window W and fluidly connected to one end of each of the first fluid tubes 111 and one end of each of the second fluid tubes 112, another end of each of the first fluid tubes 111 is fluidly connected to the first tank 21, and another end of each of the second fluid tubes 112 is fluidly connected to the second tank 22.

The flow-guiding structure 6 includes a first chamber 6a and a second chamber 6b separated from each other. The one end of each of the first fluid tubes 111 is fluidly connected to the first chamber 6a, and the one end of each of the second fluid tubes 112 is fluidly connected to the second chamber 6b. The flow-guiding structure 6 further includes a first interface 613 fluidly connected to the first chamber 6a and a second interface 614 fluidly connected to the second chamber 6b.

The liquid-cooling head 3 is used to absorb heat from an electronic heat generating element (not shown in the drawing). The pump (not shown in the drawing) for delivering the fluid may be connected from the external or may be installed in a certain element. In this exemplary embodiment, the liquid-cooling head 3 includes a pump, not shown in the drawing, and is equipped with the function of delivering the fluid. The liquid-cooling head 3 includes a first infusion port 31 and a second infusion port 32. The first infusion port 31 is fluidly connected to the first interface 613, and the second infusion port 32 is fluidly connected to the second interface 614. To be more specific, the liquid-cooling heat dissipation device of the present disclosure further includes a first pipe P1 and a second pipe P2. The first pipe P1 is connected between the first infusion port 31 and the first interface 613, and the second pipe P2 is connected between the second infusion port 32 and the second interface 614.

Figure 1:
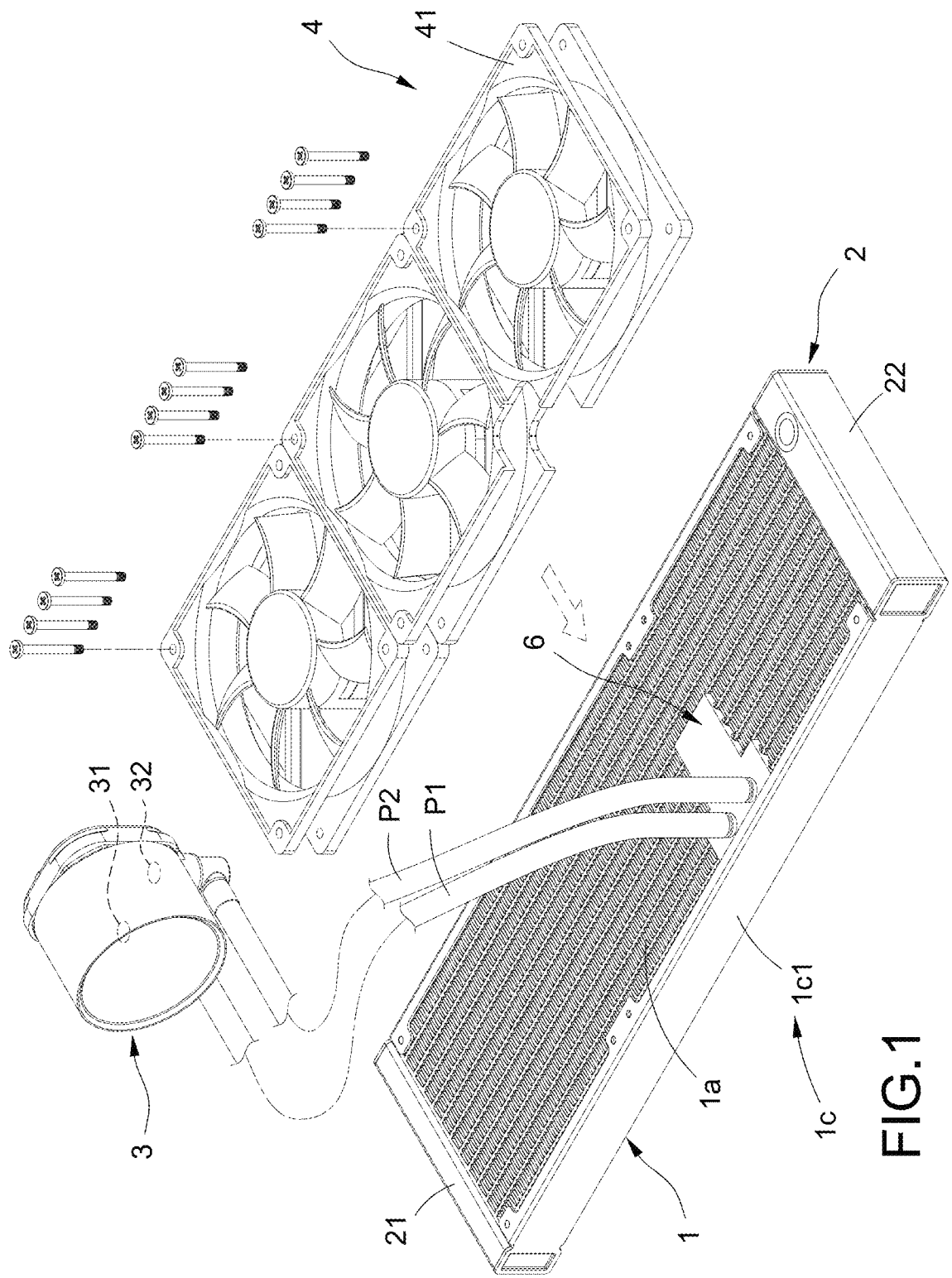
FIG. 1 is a perspective exploded view of the first exemplary embodiment of the present disclosure.
Figure 4:
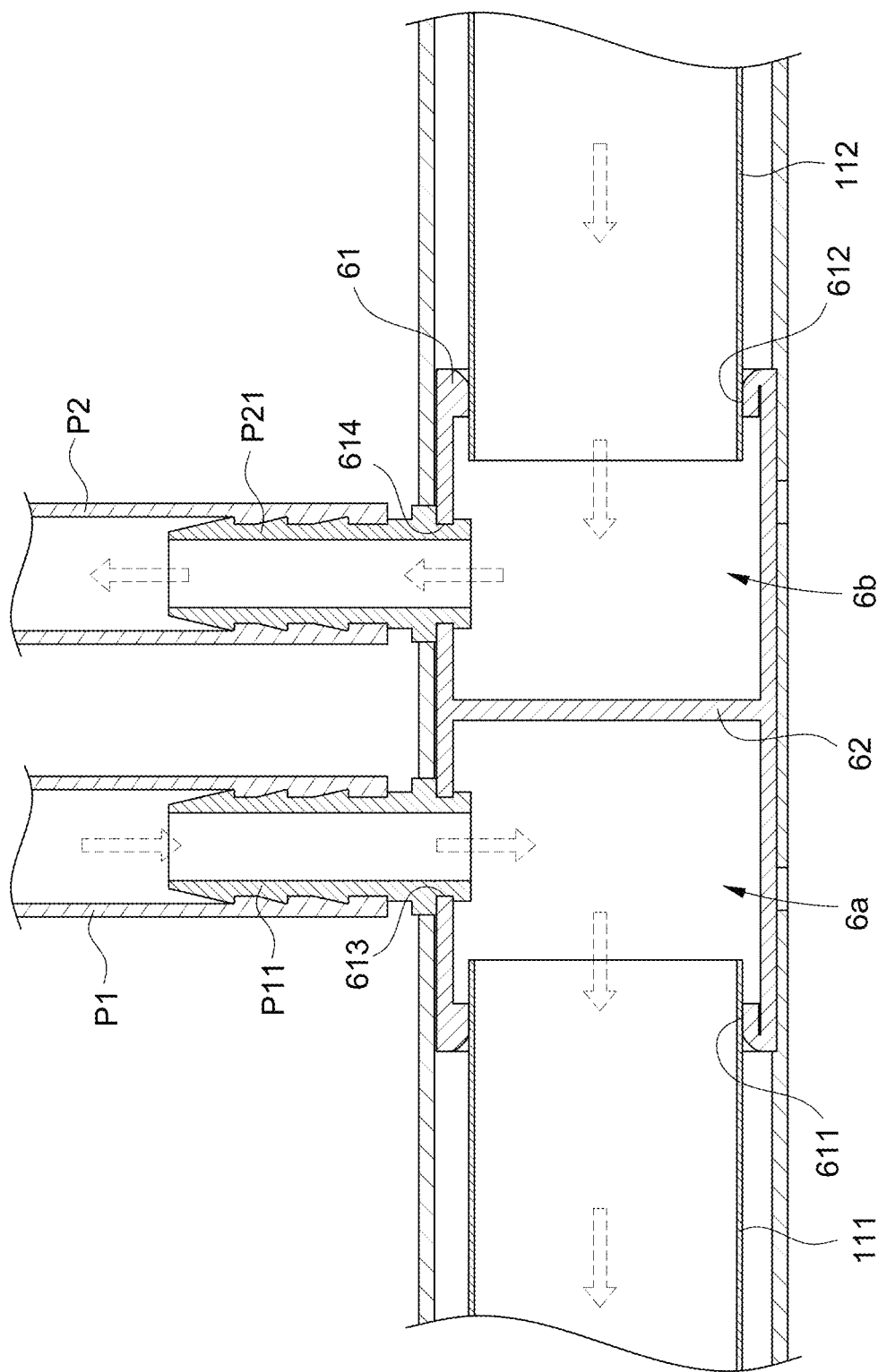
FIG. 4 is another partially cross-sectional view of the present disclosure according to FIG. 1.

As shown in FIG. 1, FIG. 3 and FIG. 4, the fluid delivered by the liquid-cooling head 3 flows through the first pipe P1 and the first interface 613 to first chamber 6a of the flow-guiding structure 6, and the fluid is further delivered from the first chamber 6a to the first tank 21 via the first fluid tubes 111, following which, the fluid flows back to the second tank 22 via the third fluid tubes 113. The liquid-cooling head 3 also draws the fluid from the second chamber 6b via the second pipe P2 and the second interface 614, in order to use the second fluid tubes 112 to draw the fluid in the second tank 22, following which the pump installed at the liquid-cooling head 3 delivers the fluid drawn to the first chamber 6a.

Accordingly, since the flow-guiding structure 6 is embedded in the through-type of window W and is connected between each of the first fluid tubes 111 and each of the second fluid tubes 112, the first interface 613 and the second interface 614 connected to the liquid-cooling head 3 may be arranged at the front side 1a and the back side 1b of the liquid-cooling radiator 1 selectively as shown in FIG. 1 and FIG. 7. Furthermore, the embedding position of the flow-guiding structure 6 may also be arranged at one of the two adjacent long lateral sides 1c1 as shown in the drawings (i.e., one of the two long lateral sides 1c1 adjacent to the location of the window W), such that the first interface 613 and the second interface 614 may also be formed at one of the long lateral sides 1c1 correspondingly as shown in FIG. 5 or FIG. 6. Accordingly, during the arrangement (laying) of pipes (first pipe P1 and second pipe P2) on the liquid-cooling heat dissipation device of the present disclosure, there are greater choices of laying manners for selection, including: the laying of pipes on the front side 1a, back side 1b or long lateral side 1c1, and the pipe laying manner is no longer limited to the first tank 21 or second tank 22 only. As a result, the technical effect of diverse laying manners of the present disclosure may be achieved. It shall be noted that one of the long lateral sides 1c1 is parallel to the fluid tube (such as, the first fluid tube 111, the second fluid tube 112 or the third fluid tube 113).

Figure 2:
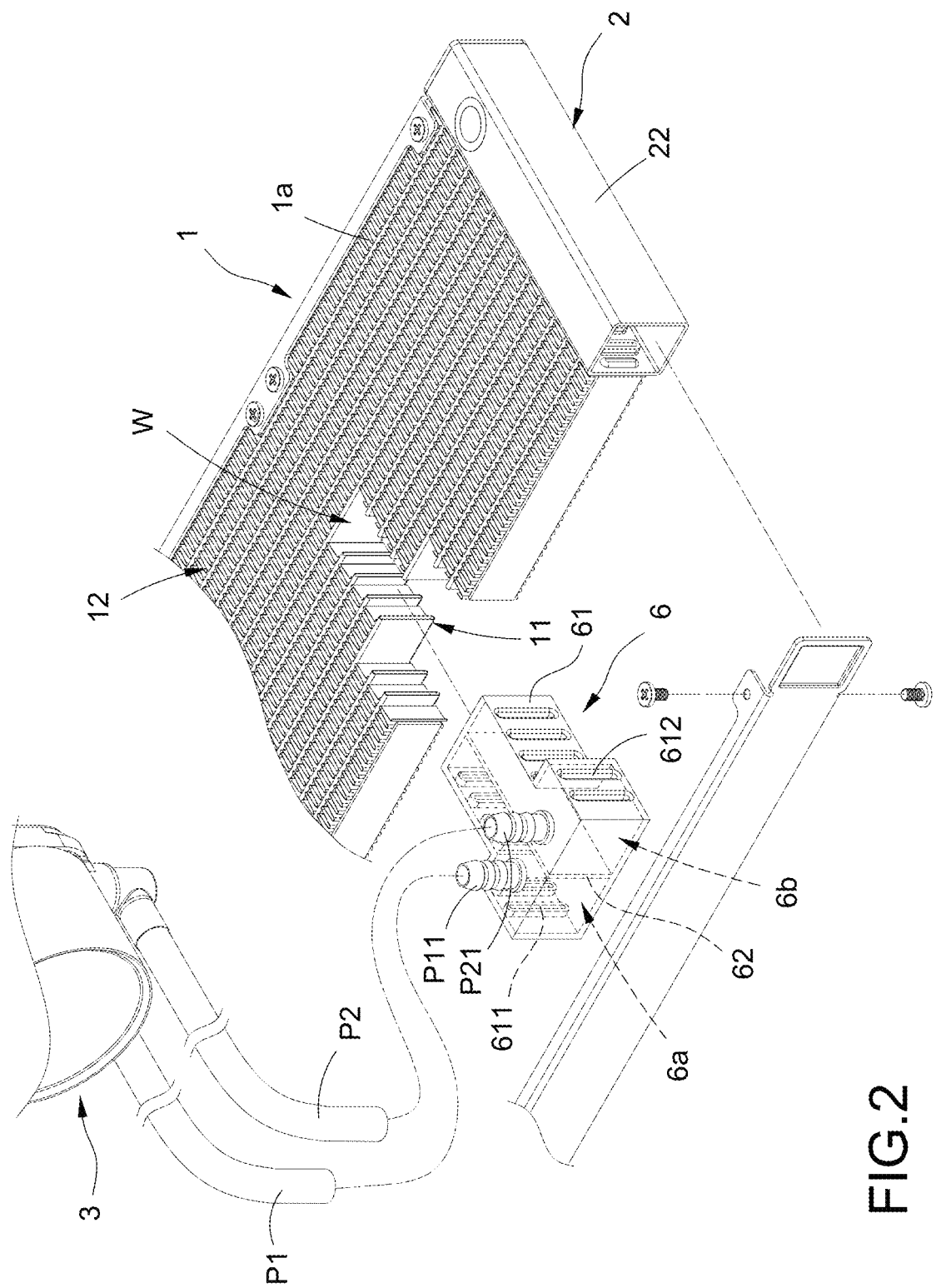
FIG. 2 is a perspective exploded view of the present disclosure according to FIG. 1.

To be more specific, as shown in FIG. 2 to FIG. 4, the flow-guiding structure 6 includes a housing 61. The housing 61 includes the first interface 613 and the second interface 614 formed thereon. In addition, the housing 61 may further include the first chamber 6a and the second chamber 6b separated from each other and formed via any feasible method. For the chamber partition method, in this exemplary embodiment, the flow-guiding structure 6 further includes a partition board 62. The partition board 62 is arranged inside the housing 61, and the housing 61 is divided into the first chamber 6a and the second chamber 6b by the partition board 62.

In addition, the housing 61 may be pre-formed with a plurality of first insertion holes 611 and a plurality of second insertion holes 612. Each of the first insertion holes 611 is fluidly connected to the first chamber 6a, and each of the second insertion holes 612 is fluidly connected to the second chamber 6b. In addition, the one end of each of the first fluid tubes 111 and is inserted into each of the first insertion holes 611, and the one end of each of second fluid tubes 112 is inserted into each of the second insertion holes 612. To prevent liquid infiltration and leakage, welding may be further performed after insertion.

To enhance the heat dissipation, as shown in FIG. 1, the liquid-cooling heat dissipation device may further include a fan assembly 4. The fan assembly 4 is arranged at the front side 1a or back side 1b of the liquid-cooling radiator 1 (it is arranged at the front side 1a as shown in the drawings). In addition, to avoid the locations of the first interface 613 and the second interface 614, the fan assembly 4 may further include a notch (not labeled in drawings). Furthermore, the fan assembly 4 may be a one-piece structure (not shown in the drawings), or it may be a multi-piece structure, as shown in FIG. 1, having a plurality of cooling fans 41 arranged parallel to each other.

The liquid-cooling heat dissipation device may further include a first pipe P1 and a second pipe P2 as shown in the drawings. Furthermore, to facilitate the connection of the pipes to the flow-guiding structure 6, two connectors may be connected to the first interface 613 and the second interface 614 respectively. Details as described in the following.

As shown in FIG. 1 to FIG. 4, in the first exemplary embodiment of the present disclosure, since both the first interface 613 and the second interface 614 are arranged at the front side 1a of the liquid-cooling radiator 1, a first connector P11 and a second connector P21 in an I-shape are selected for the two connectors. Only a small section of the first connector P11 and the second connector P21 are inserted into the first interface 613 and the second interface 614 in order to fluidly connect to the first chamber 6a and the second chamber 6b respectively. The remaining exposed sections of the first connector P11 and the second connector P21 protrude out of the housing 61 as shown in FIG. 2, in order to allow the first pipe P1 to be connected between the first infusion port 31 and the first connector P11, and to allow the second pipe P2 to be connected between the second infusion port 32 and the second connector P21.

As shown in FIG. 5, in the second exemplary embodiment of the present disclosure, since both the first interface 613 and the second interface 614 are arranged at one of the long lateral sides 1c1 of the liquid-cooling radiator 1, a first connector P12 and a second connector P22 in an L-shape are selected for the two connectors. For the L-shaped connector, it includes a longitudinal section and a lateral section connected in an L shape. The longitudinal sections of the first connector P12 and the second connector P22 are inserted into the first interface 613 and the second interface 614 respectively in order to be fluidly connected to the first chamber 6a and the second chamber 6b. The lateral sections of the first connector P11 and the second connector P21 are provided to allow one ends of the first pipe P1 and the second pipe P2 to connect thereto. The other ends of the first pipe P1 and the second pipe P2 are fluidly connected to the first infusion port 31 and the second infusion port 32 respectively, as shown in FIG. 1. Furthermore, the laying manner of the first pipe P1 and the second pipe P2 may also be arranged to be parallel to one of the long lateral sides 1c1, such that when a side cover 5 is used to cover the first connector P12 and the second connector P22 or event to partially cover the first pipe P1 and the second pipe P2, the first pipe P1 and the second pipe P2 may still extend in a generally straight line. It shall be noted that the side cover 5 is secured to one of the long lateral sides 1c1 corresponding to the first connector P12 and the second connector P22.

FIG. 6 shows a third exemplary embodiment of the present disclosure, its difference from the second exemplary embodiment relies on the laying manner of the first pipe P1 and the second pipe P2 such that they are not arranged parallel to one of the long lateral sides 1c1, and the side cover 5 cannot be used in the third exemplary embodiment. Furthermore, the first connector P13 and the second connector P23 of the third exemplary embodiment are the same as the first connector P12 and the second connector P22 of the second exemplary embodiment.

As shown in FIG. 7, in a fourth exemplary embodiment of the present disclosure, both the first interface 613 and the second interface 614 are arranged at the back side 1b of the liquid-cooling radiator 1. In addition, a first connector P13 and a second connector P23 in an L-shape are selected for the two connectors. Moreover, the first connector P13 and the second connector P23 of the fourth exemplary embodiment are also the same as the first connector P12 and the second connector P22 of the second exemplary embodiment.

Figure 8:
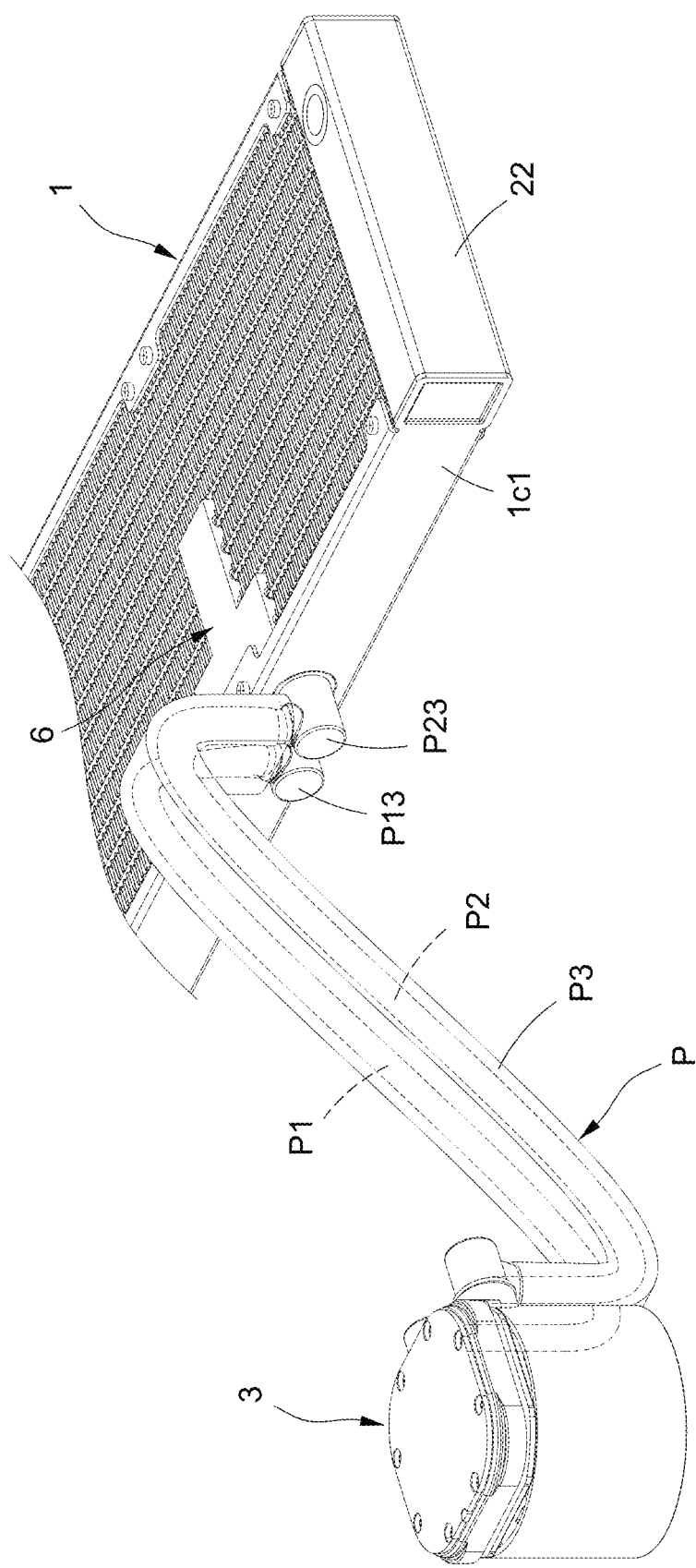
FIG. 8 is a perspective view of the fifth exemplary embodiment of the present disclosure (fan assembly omitted)

As shown in FIG. 8, in a fifth exemplary embodiment of the present disclosure, its difference from the aforementioned exemplary embodiments relies on the it includes a pipe assembly P, and the first pipe P1 and the second pipe P2 are integrated in the pipe assembly P, and at least one trunking P31 is formed in the pipe assembly P in order to allow cables (not shown in the drawings) to pass therethrough and to connect to the liquid-cooling radiator 1 and the liquid-cooling head 3. The cables may be used to supply power or to transmit signal between the liquid-cooling radiator 1 and the liquid-cooling head 3.

Figure 9:
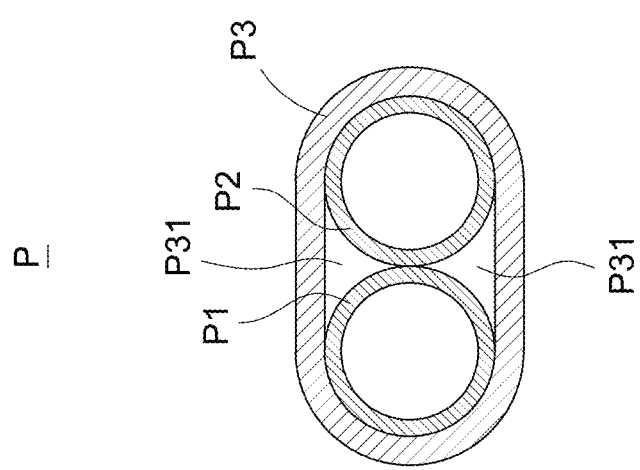
FIG. 9 is a cross-sectional view of the pipe assembly of the fifth exemplary embodiment of the present disclosure (fan assembly omitted)

As shown in FIG. 9, to be more specific, the pipe assembly P in this exemplary embodiment may further include a sleeve P3, and the first pipe P1 and the second pipe P2 may be arranged inside the sleeve. In addition, the trunking P31 may be formed by the inner wall of the sleeve P3, the outer wall of the first pipe P1 and the outer wall of the second pipe P2. In addition, the present disclosure is not limited to any specific quantity of the trunking P31.

Figure 10:
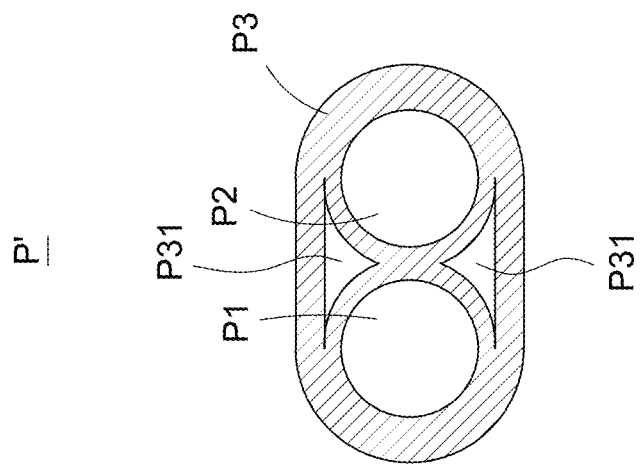
FIG. 10 is another configuration view of the fifth exemplary embodiment of the present disclosure.

The pipe assembly P in the present disclosure may not be limited to the aforementioned configuration only. For example, as shown in FIG. 10, in another configuration of this exemplary embodiment, the pipe assembly P' may also be an integrally formed pipe having the first pipe P1, the second pipe P2 and the trunking P31 formed therein.

It shall be understood that the second, third, fourth and fifth exemplary embodiments of the liquid-cooling heat dissipation device of the present disclosure are able to achieve all of the technical effects of the first exemplary embodiment.

In view of the above, the liquid-cooling heat dissipation device of the present disclosure is able to achieve the expected purpose and to overcome the drawbacks of know art.

The above description is provided to illustrate the exemplary embodiments of the present disclosure only such that it shall not be treated as limitation to the claimed scope of the present disclosure. In addition, any equivalent modification made based on the present disclosure shall be considered to be within the claimed scope of the present disclosure.

What is claimed is:
1. A liquid-cooling heat dissipation device, comprising:
a liquid-cooling radiator, comprising a window and a fluid tube assembly, the fluid tube assembly comprising a plurality of first fluid tubes and a plurality of second fluid tubes;
a tank structure, comprising a first tank and a second tank;
a flow-guiding structure, embedded in the window and fluidly connected between one end of each of the first fluid tubes and one end of each of the second fluid tubes, another end of each of the first fluid tubes and another end of each of the second fluid tubes fluidly connected to the first tank and the second tank respectively, the flow-guiding structure comprising a first chamber and a second chamber separated from each other and comprising a first interface and a second interface connected to the first chamber and the second chamber respectively, the one end of each of the first fluid tubes and the one end of each of the second fluid tubes fluidly connected to the first chamber and the second chamber respectively; and
a liquid-cooling head, comprising a first infusion port and a second infusion port, the first infusion port and the second infusion port fluidly connected to the first interface and the second interface respectively.

2. The liquid-cooling heat dissipation device according to claim 1, wherein the flow-guiding structure comprises a housing, the housing comprises the first chamber and the second chamber separated from each other, and the housing comprises the first interface and the second interface defined thereon.

3. The liquid-cooling heat dissipation device according to claim 2, wherein the flow-guiding structure further comprises a partition board, the partition board is arranged in the housing, and the housing is divided into the first chamber and the second chamber by the partition board.

4. The liquid-cooling heat dissipation device according to claim 2, wherein the housing comprises a plurality of first insertion holes and a plurality of second insertion holes fluidly connected to the first chamber and the second chamber respectively, the one end of the first fluid tubes is inserted into each of the first insertion holes, and the one end of each of the second fluid tubes is inserted into each of the second insertion holes.

5. The liquid-cooling heat dissipation device according to claim 1, wherein the fluid tube assembly further comprises a plurality of third fluid tubes, each of the third fluid tubes is fluidly connected between the first tank and the second tank.

6. The liquid-cooling heat dissipation device according to claim 5, wherein the liquid-cooling radiator further comprises a heat sink assembly, the heat sink assembly comprises a plurality of heat dissipation fins, and each of the heat dissipation fins is arranged between any two of the fluid tubes adjacent thereto.

7. The liquid-cooling heat dissipation device according to claim 1, further comprising a fan assembly, the fan assembly arranged on the liquid-cooling radiation.

8. The liquid-cooling heat dissipation device according to claim 1, further comprising a first pipe and a second pipe, the flow-guiding structure comprising a first connector and a second connector connected to the first interface and the second interface respectively, the first pipe connected between the first infusion port and the first connector, the second pipe connected between the second infusion port and the second connector.

9. The liquid-cooling heat dissipation device according to claim 8, wherein the first connector and the second connector are an I-shaped connector, the liquid-cooling radiator comprises a front side and a back side opposite from each other, the first interface and the second interface of the flow-guiding structure are arranged at the front side of the liquid-cooling radiator.

10. The liquid-cooling heat dissipation device according to claim 8, wherein the first connector and the second connector are an L-shaped connector, the liquid-cooling radiator comprises a front side and a back side opposite from each other, the first interface and the second interface of the flow-guiding structure are arranged at the back side of the liquid-cooling radiator.

11. The liquid-cooling heat dissipation device according to claim 8, wherein the first connector and the second connector are an L-shaped connector, the liquid-cooling radiator comprises a plurality of side surfaces connected to each other, the first interface and the second interface of the flow-guiding structure are correspondingly arranged at one of the pluralities of side surfaces of the liquid-cooling radiator.

12. The liquid-cooling heat dissipation device according to claim 11, wherein the one of the pluralities of side surfaces is parallel to each of the first fluid tubes or each of the second fluid tubes.

13. The liquid-cooling heat dissipation device according to claim 11, further comprising a side cover, the side cover arranged at the one of the pluralities of side surfaces corresponding to the first connector and the second connector, and the side cover covering the first connector and the second connector.

14. The liquid-cooling heat dissipation device according to claim 8, further comprising a pipe assembly, the pipe assembly comprising the first pipe and the second pipe, and at least one trunking defined in the pipe assembly.

15. The liquid-cooling heat dissipation device according to claim 14, wherein the pipe assembly comprises a sleeve, the first pipe and the second pipe are inserted in the sleeve, and the trunking is defined by an inner wall of the sleeve, an outer wall of the first pipe and an outer wall of the second pipe.

* * * * *